United States Patent [19]

Cook

[11] Patent Number: 4,588,965

[45] Date of Patent: May 13, 1986

[54] COAXIAL MAGNETRON USING THE $TE_{111}$ MODE

[75] Inventor: Alfred W. Cook, Andover, Mass.

[73] Assignee: Varian Associates, Inc., Palo Alto, Calif.

[21] Appl. No.: 623,896

[22] Filed: Jun. 25, 1984

[51] Int. Cl.[4] .................... H03B 9/10

[52] U.S. Cl. .................... 331/91; 315/39.75; 315/39.77; 331/86

[58] Field of Search .................... 315/39.55, 39.61, 39.75, 315/39.77; 331/86, 88, 90, 91

[56] References Cited

U.S. PATENT DOCUMENTS

| | | | |
|---|---|---|---|
| 3,471,744 | 10/1969 | Pryor | 331/91 |
| 4,053,850 | 10/1977 | Farney et al. | 331/91 |
| 4,194,142 | 3/1980 | Gerard | 315/39.77 |

*Primary Examiner*—Eugene R. LaRoche
*Assistant Examiner*—James C. Lee
*Attorney, Agent, or Firm*—Stanley Z. Cole; William R. McClellan; Richard B. Nelson

[57] ABSTRACT

A coaxial magnetron has a high-Q resonant cavity surrounding a multiple-resonator anode circuit and coupled by slots to alternate anode resonators. The cavity is resonant in the $TE_{111}$ mode, having two zero points of electric field on its periphery. The anode circuit is correspondingly resonant in its N/2-1 mode.

Mode suppression means damp out the degenerate $TE_{111}$ mode which is not coupled to the output iris.

The size and weight of the magnetron are much less than conventional tubes using a cavity resonant in the $TE_{011}$ mode with circular electric field.

11 Claims, 5 Drawing Figures

COAXIAL MAGNETRON USING THE $TE_{111}$ MODE

FIELD OF THE INVENTION

The invention pertains to magnetron oscillators in which the individual resonant circuits of the magnetron anode are coupled to a high-Q resonant cavity at a frequency near that of the anode resonators, in a low-order mode. The high stored energy and low loss of the cavity stabilizes the frequency of the entire assemblage of coupled circuits.

PRIOR ART

The coaxial magnetron was developed to overcome frequency instabilities inherent in the simple magnetron oscillator, such as "pushing" (frequency change by applied voltage), "pulling" (frequency change by reflected wave from the load), and frequency-modulation (FM) noise. The basic magnetron has a low Q-factor because the capacitance across the anode resonators is high.

Prior-art coaxial magnetrons used a cylindrical cavity surrounding the anode which was resonant in the circular-electric-field mode $TE_{011}$. This mode has fine electrical properties. The cavity is big, storing much energy. The symmetric circular field couples uniformly to alternate anode resonators through coupling slots, so coupling is maximized for the desired $\pi$ mode resonance of the anode resonator array.

There are, however, some disadvantages to the $TE_{011}$ mode coaxial resonator. It is a higher-order mode, so that spurious modes, resonant near the operating frequency, can interfere with the operation. These spurious modes can be damped out by lossy material placed to take advantage of the fact that the spurious modes have non-circular wall currents, but this is an added complication.

A more serious disadvantage is the very large size of a $TE_{011}$ resonator. In some applications space and weight are at a premium. It is also usually necessary to provide a return path for the magnetic flux around the large resonator, further increasing the size and weight.

SUMMARY OF THE INVENTION

The object of the invention is to provide a cavity-stabilized magnetron of minimum size and weight.

This object is achieved by a resonator operating in the lowest order, $TE_{111}$ mode of a coaxial cylindrical resonator, or the equivalent fundamental mode of a resonator of different shape. The coupled anode circuits of the magnetron resonate in the N/2-1 mode.

DESCRIPTION OF THE PREFERRED EMBODIMENTS

Figure 1:
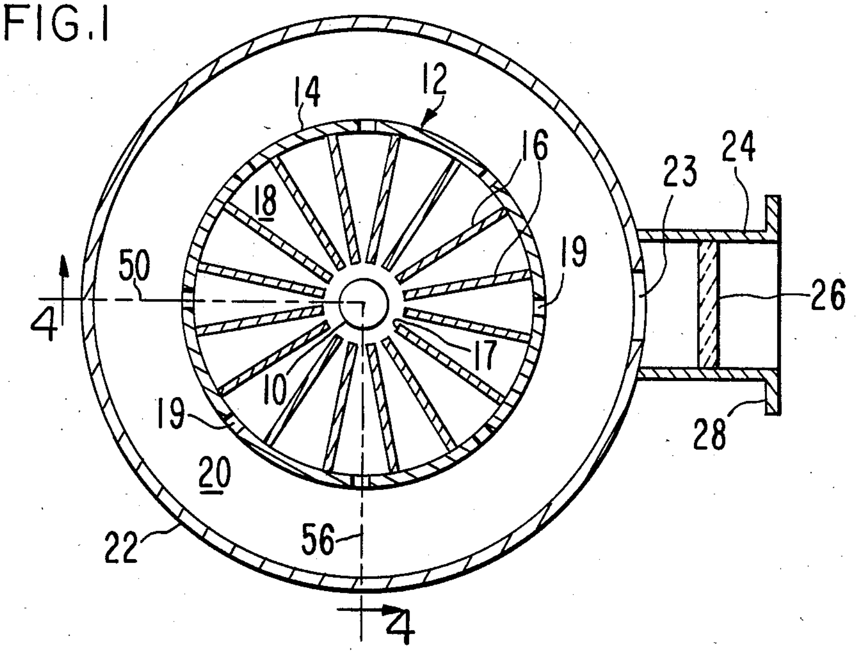
FIG. 1 is a schematic section perpendicular to the axis of a magnetron embodying the invention.

FIG. 1 is a schematic section perpendicular to the axis of a coaxial magnetron embodying the invention. At the center is a cylindrical thermionic cathode 10 enclosing a radiant heater (not shown). Coaxially around cathode 10 is an anode block 12 comprising a cylindrical shell 14 joined to an array of radial vanes 16 whose inner tips 17 form the microwave interaction anodes facing cathode 10. Each adjacent pair of vanes forms between them an anode cavity 18 which is resonant near the desired operating frequency, creating a microwave electric field between vane tips 17 which interacts with the electrons circulating around between cathode 10 and anode tips 17 as guided by an axial magnetic field generated by a permanent magnet (not shown).

Alternate cavities 18 are electromagnetically coupled via axial slots 19 to a surrounding coaxial resonant cavity 20.

In the prior art coaxial magnetron, each cavity 18 had a microwave field phase shift of $\pi$ radians with respect to its neighbors. Thus all the cavities coupled to stabilizing cavity 20 had identical fields. This mode was called the N/2 mode. For a set of N cavities, there would be N/2 complete cycles of electric field strength in traversing a path around the anode. The excitation of cavity 20 was in a mode with circular electric field and complete axial symmetry.

Cavity 20 is coupled to the external useful load by a coupling iris 23 leading into an output waveguide 24 which is sealed off by a vacuum-tight dielectric window 26. Waveguide 24 has a flange 28 for joining to the waveguide to the load.

In the present invention, the set of anode resonators is made to operate in the so-called N/2-1 mode. In this mode there are only N/2-1 cycles of field around the traverse of the anode. There are two points 180 degrees apart where the rf electric field of the anode resonator set falls to zero, and two intermediate points where the fields are maximum but out of phase with each other.

In a coaxial magnetron the stabilizing cavity 20 surrounding the anode structure 12 couples to the anode resonators 18 via axial slots 19 in the common wall 14. To optimize this coupling, the resonator should have currents in its inner wall crossing the slots, that is circulating about the axis. In the customary description of the modes in a circular waveguide these are designed as $TE_{nm}$ modes. The mode with the lowest cutoff frequency, called the "dominate mode," is the $TE_{11}$ mode. When the ends of a section of waveguide are closed to make a resonator, the lowest-frequency resonance is the $TE_{111}$ mode, whose fields are sketched in FIG. 2A in customary orthogonal views. The electric field, shown by solid lines 30 has one cyclic variation over a path going around the axis 31, and one cyclic variation over a path between the ends 33 parallel to axis 31. The magnetic field lines 32 make closed loops about the electric field lines 30.

For a coaxial line or resonator, the mode symmetry is the same but the field patterns are displaced by the central conductor. FIG. 2B is a view parallel to the axis of the fields of the $TE_{111}$ mode in a coaxial resonator. The magnetic field lines 32' make closed loops very much as in FIG. 2A. The electric field lines 30', in the plane of the paper, are deformed from those in FIG. 2A by the presence of the center conductor 12'.

Figure 2A:
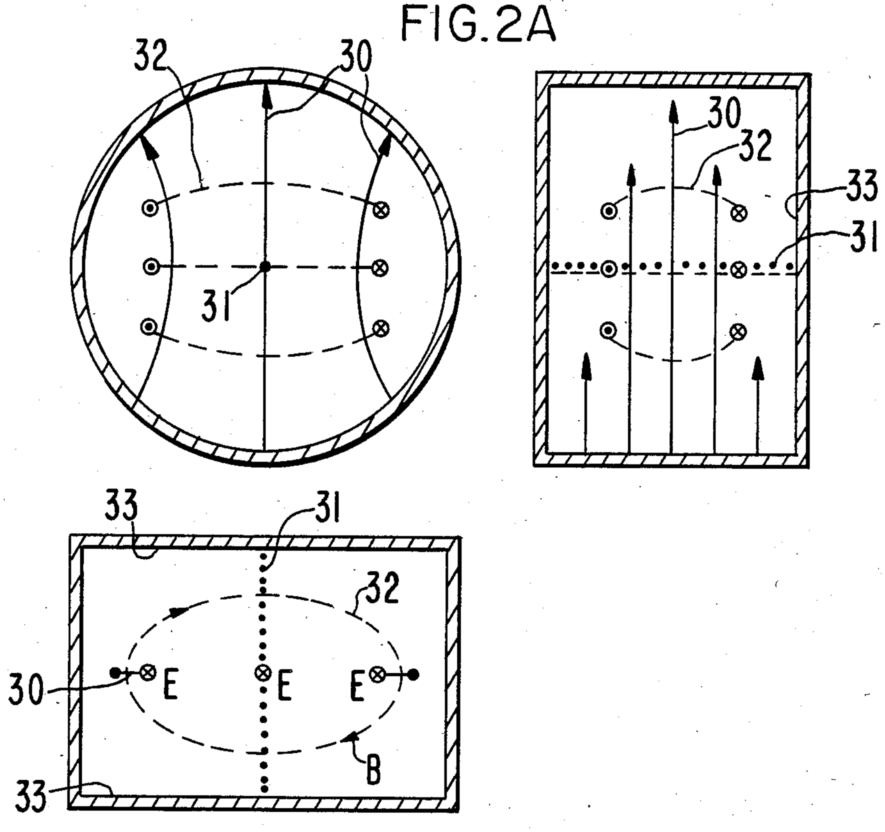
FIGS. 2A and 2B are sketches of the field patterns of the $TE_{111}$ mode.
Figure 2B:
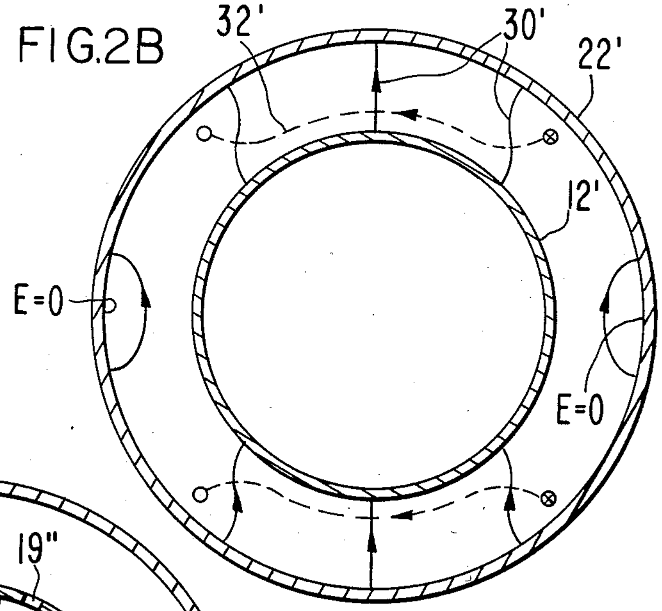

One problem with the use of the $TE_{111}$ mode in a coaxial cavity is that the mode is degenerate, i.e. there is another mode exactly like that of FIG. 2A or 2B but with the field pattern rotated 90 degrees. These are separate, uncoupled modes with exactly the same resonant frequency if the resonator is a figure of revolution, which is by far the cheapest and best shape. The output coupling as shown on the right of FIG. 1 will couple strongly to the mode oriented as in FIG. 2B. This mode has maximum electric field at top and bottom, and maximum magnetic field at right and left. The magnetic field provides the dominant coupling through an iris, which is the usual way of coupling to a waveguide, or a coupling loop which is common when coupling to a coaxial transmission line.

On the other hand, the spurious mode with fields rotated 90 degrees will have no coupling at all to a symmetric iris. Hence the impedance of the resonator system will be much higher, so the tube will oscillate in this mode with no usable output power.

Figure 3:
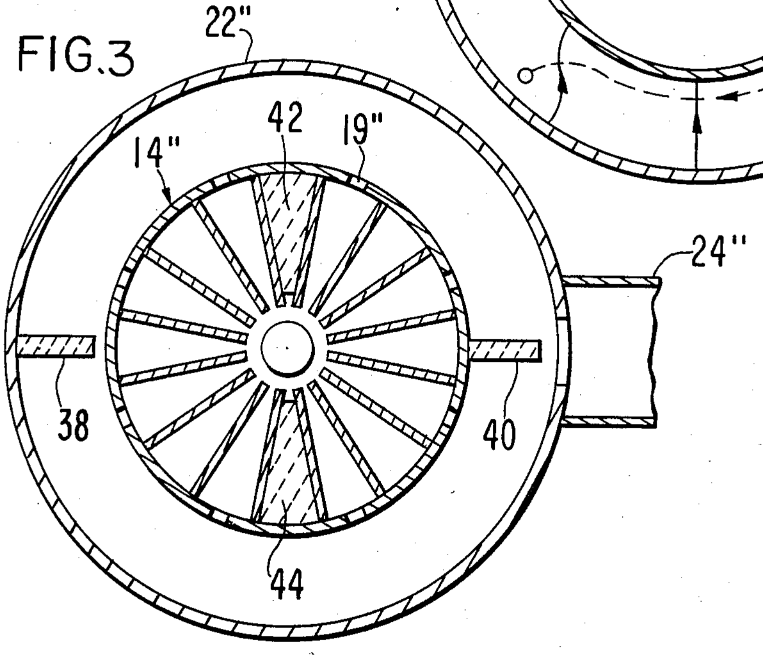
FIG. 3 is a schematic section showing means for suppressing the degenerate $TE_{111}$ mode.

I have devised several ways to prevent oscillation in the spurious mode. Some involve means (other than the output coupling) for loading the structure at points where the loading will be a maximum for the spurious mode and a minimum for the desired mode. FIG. 3 shows some embodiments. Slabs 38, 40 of lossy dielectric such as beryllia ceramic loaded with silicon carbide, sold as "carberlox" are located in azimuth on the plane containing the output coupling and the axis. At these points the electric fields of the desired mode of the cavity go to zero, so the loading is low for the desired mode and high for the spurious orthogonal mode.

Alternatively, I load the anode chamber structure at points where the fields of its N/2-1 mode in the desired orientation go to zero. These points are in a plane 90 degrees removed in azimuth from the output coupling. Lossy dielectric slugs 42, 44 are inserted into the anode chambers.

Also, the unwanted degenerate mode may have its resonant frequency changed away from the operating frequency by conductive members replacing lossy members 38, 40, 42, 44 which short-circuit or reactively load the anode chambers 18 of stabilizing cavity 20. In a circularly symmetric structure the $TE_{111}$ modes may have any angular position about the axis. Loading or detuning the spurious mode has the effect of locking the operating mode to the desired angular position. Alternatively, lossy members may be placed in or near the coupling slots 19''. In this case the orthogonal mode absorber may be integrated with the absorbers commonly located near the ends of coupling slots 19 to damp out resonances of the slots themselves.

Figure 4:
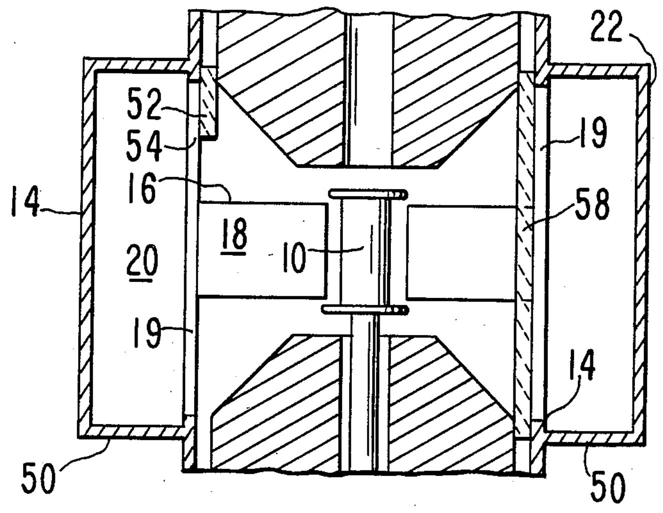
FIG. 4 is a composite section of the magnetron of FIG. 1 showing an alternative mode-locking scheme.

FIG. 4 shows an opened-up axial section of a magnetron embodying the invention sectioned as indicated by 4—4 in FIG. 1. Near the azimuthal position 50, the plane of the output coupler, a lossy slot-mode damping element 52 covers only an end 54 of coupling slots 19. At azimuthal position 56, 90 degrees from position 50, mode damper 58 covers the entire slot 19, thus loading both slot modes and the spurious orthogonal mode of anode chambers 18.

The advantage of the $TE_{111}$ resonator is that it is considerably smaller than the prior-art $TE_{011}$ resonator. While this implies a somewhat lower Q-factor, it is nevertheless adequate for many applications.

In a coaxial waveguide having an outer radius a and a central conductor radius b, the cutoff wavelength of the prior-art $TE_{01}$ mode is given by $$\lambda_{coll}=1.920(a-b)$$

and the cutoff wavelength of the $TE_{11}$ mode of the present invention is approximately $$\lambda_{coll}=\pi(a+b).$$

From the latter equation it is seen that the spacing between inner and outer conductors can approach zero with the cutoff wavelength approaching a limit of $2b\,\pi$, the circumference of the center conductor. Thus in principle, when the circumference of anode block 12 is greater than one free-space wavelength at the operating frequency, the radial thickness of the coupled resonator can be as small as desired, consistent with the desired energy storage and voltage breakdown requirements.

As the radial thickness of the cavity is reduced, the number of spurious modes resonant at the operating frequency is reduced, thereby reducing the danger of oscillation in unwanted modes. For example, in the prior-art $TE_{01}$ mode the cutoff wavelength decreases quite proportionately with the radial cavity width $(a-b)$. For any desired cutoff wavelength, there is thus a lower limit to the width. When the radial thickness is less than about 0.5 times the free-space wavelength, the circular electric field mode cannot be sustained at the operating frequency.

In practice, resonant cavities are operated at a frequency near 1.4 times the cutoff frequency of the waveguide from which they are derived. One may then compare the $TE_{01}$ and $TE_{11}$ waveguide modes having the same cutoff frequency, same center conductor radius b corresponding to the anode block 12, and outer cavity radii $a_{01}$ and $a_{11}$. Combining the above equations: $1.92(a_{01}-b)=3.14(a_{11}+b)$ whence $a_{01}=1.63(a_{11}+b)+1.92b$ or $a_{01}=1.63a_{11}+3.55b$.

If, for example $a_{11}=2b$ (cavity width equal to the anode block radius) then $a_{01}=6.68b$ or 3.34 times the radius of the inventive $TE_{111}$ cavity.

The smaller cavity cuts down the volume, and also the weight of the magnetron by at least a factor proportional to the square of the outer radius. In the example above this would be about an order of magnitude. A further advantage of the invention is that it permits a shorter and lighter return path for the flux of the magnetron's interaction-controlling magnet.

It will be obvious to those skilled in the art that many different embodiments of my invention are possible. The stabilizing cavity need not be a right circular cylinder, although that is the simplest form. Various non-circular shapes can remove the degeneracy of the two $TE_{111}$ modes.

Alternatively, the resonant frequency of the undesired mode can be changed by conductive material inside the cavities, such as making vanes 38, 40 of metal. It may still be necessary to provide selective loading of the unwanted mode. A tuner can be used to vary the operating frequency, as is done in the prior-art $TE_{01}$ mode coaxial magnetrons by moving a metallic plate to change the effective volume of the cavity.

The illustrated embodiments are intended to be descriptive and not limiting. The invention is to be limited only by the following claims and their legal equivalents.

I claim:

1. A magnetron oscillator comprising:

a generally cylindrical electron-emitting cathode, an anode insulated from and surrounding said cathode, the inner surface of said anode facing said cathode being generally a cylinder coaxial with said cathode, said anode having a plurality of gaps parallel to the axis of said cylinder, a plurality of resonant chambers in said anode in wave-transmissive connection with said gaps, a resonant cavity surrounding said anode, a plurality of apertures in the wall between alternate ones of said chambers and said cavity for mutual coupling, means for extracting electromagnetic wave energy from said cavity, and means for causing said cavity to resonate at approximately the resonate frequency of said anode chambers in an operating mode having electric field perpendicular to said axis, one cyclic variation of said electric field strength over a path going around said anode, and one cyclic variation over a path going across said cavity generally parallel to said axis.

2. The magnetron of claim 1 wherein the interior surface of said cavity is generally a figure of revolution about said axis.

3. The magnetron of claim 1 wherein said mode is the $TE_{111}$ mode.

4. The magnetron of claim 1 wherein said coupling apertures are slots parallel to said axis.

5. The magnetron of claim 1 wherein said means for extracting wave energy is located near a first angular position about said axis, and said means for causing said cavity to resonate includes means for locking said operating mode to have a maximum magnetic field near said first angular position.

6. A magnetron oscillator comprising a generally cylindrical electron-emitting cathode, an anode insulated from and surrounding said cathode, the inner surface of said anode facing said cathode being generally a cylinder coaxial with said cathode, said anode having a plurality of gaps parallel to the axis of said cylinder, a plurality of resonant chambers in said anode in wave-transmissive connection with said gaps, and a resonant cavity surrounding said anode, said cavity having an outer wall surrounding said anode and the distance from the outer surface of said anode to the inner surface of said outer wall being less than one-half of the free-space wavelength of a wave at the frequency of resonance of said anode chambers.

7. A magnetron oscillator comprising a generally cylindrical electron-emitting cathode, an anode insulated from and surrounding said cathode, the inner surface of said anode facing said cathode being generally a cylinder coaxial with said cathode, said anode having a plurality of gaps parallel to the axis of said cylinder, a plurality of resonant chambers in said anode in wave-transmissive connection with said gaps, a resonant cavity surrounding said anode, means for extracting electromagnetic wave energy from said cavity, and means for locking said cavity to resonate in an operating $TE_{111}$ mode with a maximum of electric field at an azimuthal location approximately 90 degrees from said means for extracting wave energy.

8. The magnetron of claim 7 wherein said locking means comprises lossy material coupled to at least one of said anode chambers located azimuthally approximately 90 degrees from said means for extracting wave energy.

9. A magnetron as defined in claim 7 wherein said mode locking means comprises wave absorbing material entirely covering at least one of said apertures located azimuthally approximately 90 degrees from said means for extracting wave energy and wave absorbing material covering no more than a portion of the apertures approximately in the plane of said means for extracting wave energy.

10. A magnetron as defined in claim 7 wherein said mode locking means comprises conductive members short-circuiting at least one of said anode gaps located azimuthally approximately 90 degrees from said means for extracting wave energy.

11. A magnetron as defined in claim 7 wherein said mode locking means comprises wave absorbing material substantially filling the two diametrically opposed anode chambers which are both located azimuthally approximately 90 degrees from said means for extracting wave energy.

* * * * *